(12) United States Patent
Hong et al.

(10) Patent No.: US 8,704,285 B2
(45) Date of Patent: Apr. 22, 2014

(54) CAPACITOR DEVICE AND DISPLAY APPARATUS HAVING THE SAME

(75) Inventors: Sang-Min Hong, Yongin (KR); Hee-Chul Jeon, Yongin (KR)

(73) Assignee: Samsung Display Co., Ltd., Yongin, Gyeonggi-Do (KR)

(*) Notice: Subject to any disclaimer, the term of this patent is extended or adjusted under 35 U.S.C. 154(b) by 104 days.

(21) Appl. No.: 13/297,426

(22) Filed: Nov. 16, 2011

(65) Prior Publication Data

US 2012/0146034 A1    Jun. 14, 2012

(30) Foreign Application Priority Data

Dec. 14, 2010    (KR) .......................... 10-2010-0127855

(51) Int. Cl.
*H01L 27/108*    (2006.01)
*H01L 21/8242*    (2006.01)

(52) U.S. Cl.
USPC .......................................... 257/306; 438/253

(58) Field of Classification Search
USPC ............. 438/23, 253, 381, 396; 257/303, 306
See application file for complete search history.

(56) References Cited

U.S. PATENT DOCUMENTS

| | | | | |
|---|---|---|---|---|
| 6,069,050 A | * | 5/2000 | Hou et al. | 438/393 |
| 8,022,790 B2 | * | 9/2011 | Iguchi | 333/185 |
| 2008/0237585 A1 | | 10/2008 | Kim | |
| 2009/0009496 A1 | | 1/2009 | Kwak et al. | |
| 2011/0240964 A1 | * | 10/2011 | Ko et al. | 257/40 |

FOREIGN PATENT DOCUMENTS

| | | |
|---|---|---|
| KR | 10 2003-0035219 A | 5/2003 |
| KR | 10 2005-0104610 A | 11/2005 |
| KR | 10 2006-0003632 A | 1/2006 |
| KR | 10-0840100 B1 | 6/2008 |
| KR | 10 2008-0088083 A | 10/2008 |
| KR | 10 2009-0059843 A | 6/2009 |

OTHER PUBLICATIONS

Korean Notice of Allowance in KR 10-2010-0127855, dated May 31, 2012 (Hong, et al.).

* cited by examiner

*Primary Examiner* — Calvin Lee
(74) *Attorney, Agent, or Firm* — Lee & Morse, P.C.

(57) ABSTRACT

Present embodiments may be directed to a capacitor device, including a first electrode, which includes a first area and a second area, separated from each other, and a first bridge located between the first area and the second area, the first bridge electrically interconnecting the first area and the second area; a second electrode arranged to face the first electrode; and a dielectric layer between the first electrode and the second electrode.

24 Claims, 11 Drawing Sheets

CAPACITOR DEVICE AND DISPLAY APPARATUS HAVING THE SAME

CROSS-REFERENCE TO RELATED PATENT APPLICATION

This application claims the benefit of Korean Patent Application No. 10-2010-0127855, filed on Dec. 14, 2010, in the Korean Intellectual Property Office, the disclosure of which is incorporated herein in its entirety by reference.

BACKGROUND

1. Field

Embodiments relate to a capacitor device and a display apparatus having the same.

2. Description of the Related Art

In flat panel display apparatuses, i.e., organic light emitting display devices, liquid crystal display devices, etc., scan signals and data signals are applied to a device unit including a plurality of thin-film transistors and a capacitor via scan lines and data lines. The signals applied to the device unit are then transmitted to light emitting devices, electrically connected to the device unit. In response to the applied signals, an image is formed.

SUMMARY

Present embodiments may be directed to a capacitor device.

According to an embodiment, a capacitor device may include a first electrode, which includes a first area and a second area, separated from each other, and a first bridge located between the first area and the second area, the first bridge electrically interconnecting the first area and the second area; a second electrode arranged to face the first electrode; and a dielectric layer between the first electrode and the second electrode.

A first wiring unit may be connected to the first electrode, and the first wiring unit may be connected to the first area or the second area.

The capacitor device may further include a third electrode arranged to face the first electrode at a location corresponding to the first area or the second area to which the first wiring unit may be connected.

The third electrode may be on a same layer as the first wiring unit.

The second electrode may include a third area and a fourth area, separated from each other, and a second bridge located between the third area and the fourth area, the second bridge electrically interconnecting the third area and the fourth area.

The third area and the fourth area may be arranged at locations corresponding to the first area and the second area, respectively.

The capacitor device may further include a third electrode arranged to face the first electrode at a location corresponding to the first area or the second area to which the first wiring unit is connected.

The third electrode may be on a same layer as the first wiring unit.

A first wiring unit may be connected to the first electrode, the first wiring unit may be located between the first area and the second area, and the first wiring unit may be connected to the first area or the second area.

The capacitor device may further include a third electrode arranged to face the first electrode at a location corresponding to the first area and the second area.

The third electrode may be on a same layer as the first wiring unit.

The second electrode may include a third area and a fourth area, separated from each other, and a second bridge that is located between the third area and the fourth area, the second bridge electrically interconnecting the third area and the fourth area.

The third area and the fourth area may be arranged at locations corresponding to the first area and the second area, respectively.

The capacitor device may further include a plurality of third electrodes, arranged to face the first electrode at a location corresponding to the first area and the second area and a location corresponding to the third area and the fourth area, respectively.

The plurality of third electrodes may be on a same layer as the first wiring unit.

According to another embodiment, a flat panel display apparatus may include at least one thin-film transistor (TFT), a capacitor, and a light emitting device, each TFT including a semiconductor layer, a gate electrode, and source and drain electrodes, the capacitor including a first electrode, which includes a first area and a second area that may be separated from each other, and a first bridge that may be located between the first area and the second area, the first bridge electrically interconnecting the first area and the second area, a second electrode arranged to face the first electrode, and a dielectric layer between the first electrode and the second electrode; and the light emitting device including a pixel electrode connected to the source electrode or the drain electrode, a counter electrode facing the pixel electrode, and an electroluminescent layer located between the pixel electrode and the counter electrode.

The first electrode may be on a first layer, and the first layer has an identical material to one material of the semiconductor layer, the gate electrode, or the source and drain electrodes, and the second electrode may be on a second layer, and the second layer has an identical material to one material of the semiconductor layer, the gate electrode, or the source and drain electrodes, the material of the second electrode is different from the material of the first electrode.

A first wiring unit may be connected to a power voltage supply line of the flat panel display apparatus, and a second wiring unit may be connected to one of the source or drain electrode of the TFT.

The first wiring unit may be connected to the first area or the second area, and the power voltage supply line may be arranged to overlap the first area or the second area.

The second electrode may include a third area and a fourth area, separated from each other; and a second bridge located between the third area and the fourth area, the second bridge electrically interconnecting the third area and the fourth area.

The capacitor may further include a third electrode arranged to face the first electrode at a location corresponding to the first area or the second area to which the first wiring unit is connected, and the third electrode may be on a third layer, and the third layer has an identical material to one material of the semiconductor layer, the gate electrode, or the source and drain electrodes, the material of the third electrode is different from the material of the first and second electrodes.

The first wiring unit may be located between the first area and the second area, and the first wiring unit may be connected to the first area and the second area.

The second electrode may include a third area and a fourth area separated from each other, and a second bridge that is located between the third area and the fourth area, the second bridge electrically interconnecting the third area and the fourth area.

The flat panel display apparatus may further include a third electrode arranged to face the first electrode at a location corresponding to the first area and the second area.

The light emitting device may be an organic light emitting diode.

BRIEF DESCRIPTION OF THE DRAWINGS

The above and other features and advantages of the inventive concept will become more apparent by describing in detail exemplary embodiments thereof with reference to the attached drawings in which.

DETAILED DESCRIPTION

Korean Patent Application No. 10-2010-0127855, filed on Dec. 14, 2010, in the Korean Intellectual Property Office, and entitled "Capacitor Device and Display Apparatus Having the Same," is incorporated by reference herein in its entirety.

The inventive concept will now be described more fully hereinafter with reference to the accompanying drawings, in which exemplary embodiments of the inventive concept are illustrated. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

Figure 1:
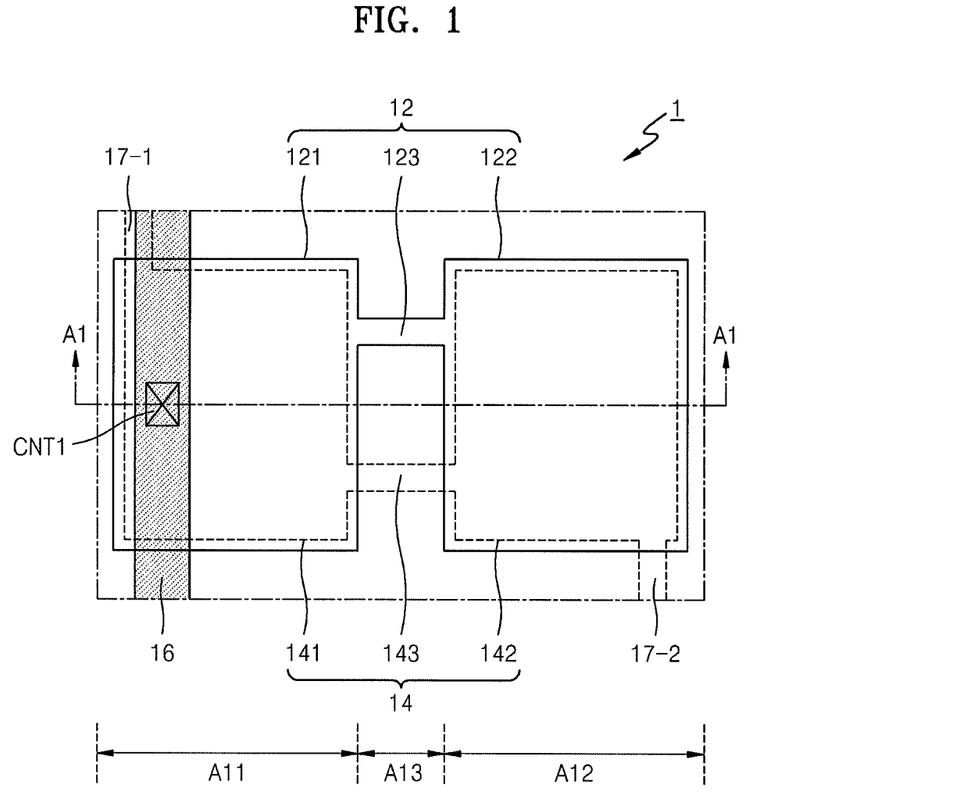
FIG. 1 is a schematic plan view of a capacitor device according to a first embodiment.
Figure 2:
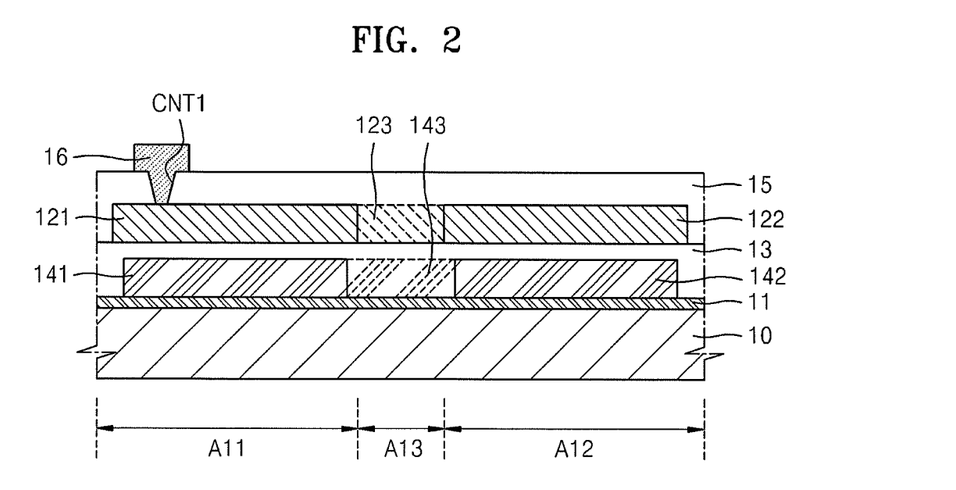
FIG. 2 is a sectional view taken along line A1-A1 of FIG. 1.

FIG. 1 is a schematic plan view of a capacitor device 1 according to a first embodiment. FIG. 2 is a sectional view taken along line A1-A1 of FIG. 1.

Referring to FIGS. 1 and 2, the capacitor device 1, according to the present embodiment, includes a substrate 10, a first electrode 12 and a second electrode 14 that are arranged on a buffer layer 11 to face each other, and a dielectric layer 13 located between the first electrode 12 and the second electrode 14.

The first electrode 12 includes a first area 121 and a second area 122, which are formed on a same layer and are separated from each other, and a first bridge 123, which is located between the first area 121 and the second area 122 and electrically interconnects the first area 121 and the second area 122.

The second electrode 14 also includes a third area 141 and a fourth area 142, which are formed on a same layer and are separated from each other, and a second bridge 143, which is located between the third area 141 and the fourth area 142 and electrically interconnects the third area 141 and the fourth area 142. The third area 141 and the fourth area 142 are arranged to correspond to the first area 121 and the second area 122, respectively.

Although the first bridge 123 and the second bridge 143 are shown as having straight shapes in FIGS. 1 and 2, the present embodiments are not limited thereto. In other words, the first bridge 123 and the second bridge 143 may have any suitable shape that electrically interconnects the first area 121 and the second area 122 and the third area 141 and the fourth area 142, respectively.

A first wiring unit 16 is connected to the first electrode 12, and second wiring units 17-1 and 17-2 are connected to the second electrode 14. The first wiring unit 16 is formed on an insulation layer 15, is connected to the first area 121 of the first electrode 12 via a first contact hole CNT1, and may be arranged at a location overlapping the first area 121.

During fabrication of a conventional capacitor device on the substrate, if a dielectric layer is damaged by various particles, a short-circuit may occur between the first electrode and the second electrode. In this case, the conventional capacitor device may be entirely damaged.

However, in the capacitor device 1, according to the present embodiment, if the dielectric layer 13 is damaged by particles at a second portion A12 where the second area 122 and the fourth area 142 are located and the first wiring unit 16 is not connected, damage of the capacitor device 1 may be prevented. The capacitor device 1 may be prevented from damage by floating the second area 122 and the fourth area 142 by cutting the first bridge 123 and the second bridge 143, or by floating the second area 122 by cutting the first bridge 123. In other words, although the entire area of the capacitor device 1 is reduced, the functions of the capacitor device 1 may be performed only with a first portion A11, where the first area 121 and the third area 141 are located. Thus, the capacitor device 1 may be prevented from being entirely damaged.

Figure 3:
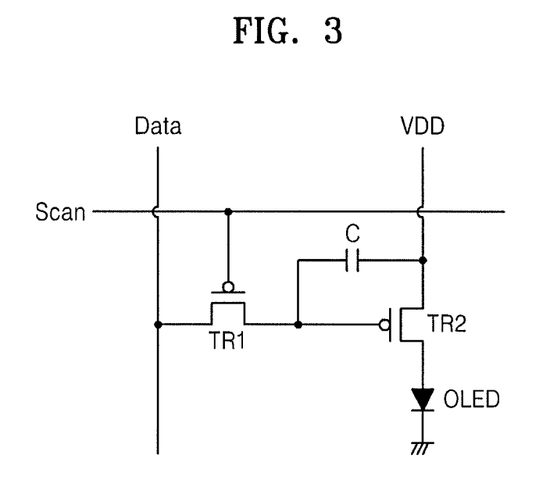
FIG. 3 is a pixel circuit diagram of an organic light emitting display apparatus including the capacitor device according to the first embodiment.
Figure 4:
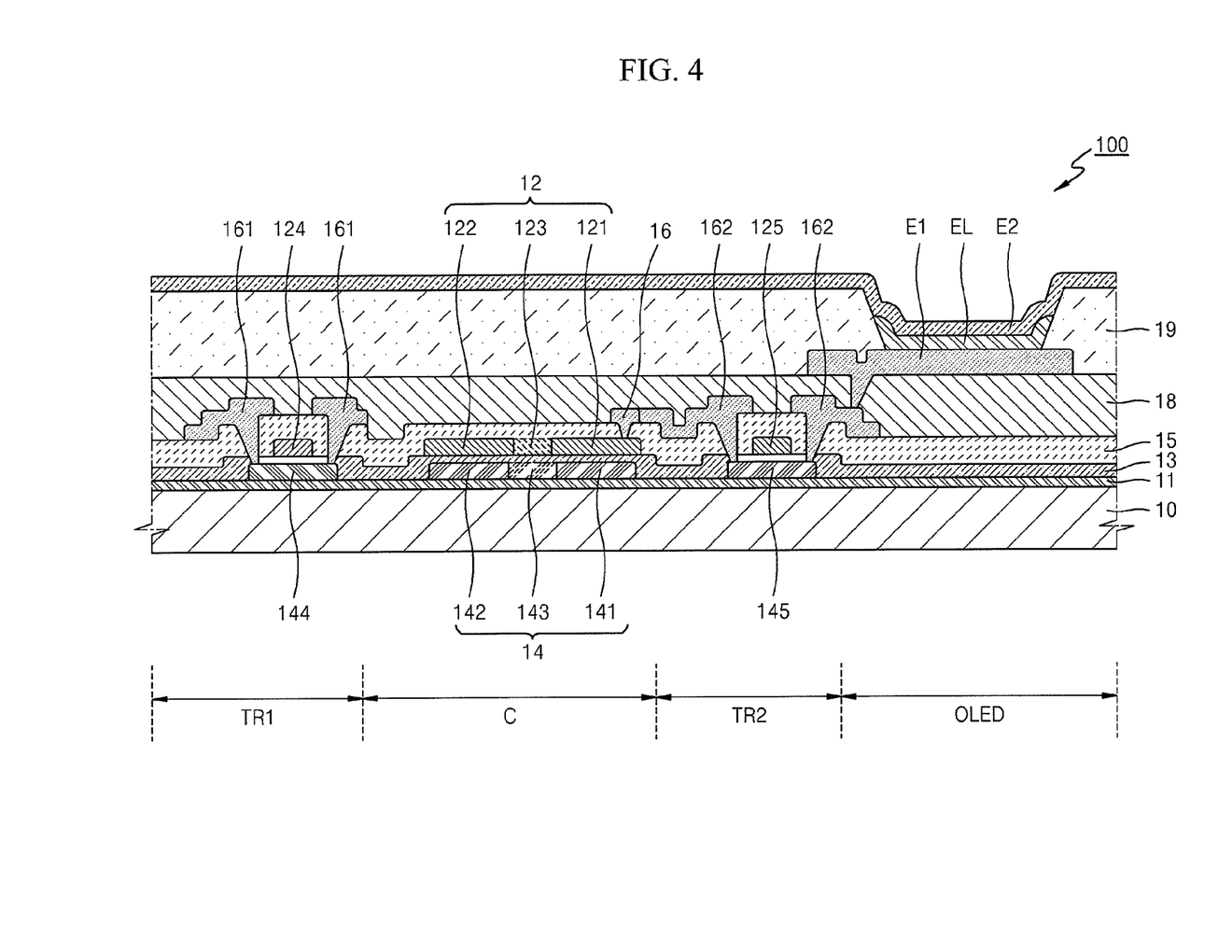
FIG. 4 is a schematic sectional view of a pixel of the organic light emitting display apparatus including a capacitor device according to the first embodiment.

FIG. 3 is a pixel circuit diagram of an organic light emitting display apparatus including the capacitor device according to the first embodiment. FIG. 4 is a schematic sectional view of the pixel of the organic light emitting display apparatus, including a capacitor device according to the first embodiment.

Referring to FIGS. 3 and 4, the pixel of the organic light emitting display apparatus 100 including the capacitor device 1, according to the first embodiment, includes a plurality of conductive lines, i.e., a scan line "Scan", a data line "Data," a power voltage supply line "VDD," etc., an organic light emitting diode (OLED) having an electroluminescent area EL, first and second thin-film transistors (TFTs) TR1 and TR2, and a capacitor C. However, present embodiments are not limited to the arrangements and numbers of TFTs and the capacitor C. Any various combinations of two or more TFTs and capacitors may be used in a pixel circuit unit.

A gate electrode 124 of the first TFT TR1 is connected to the scan line "Scan," and a first electrode 161 of the first TFT TR1 is connected to the data line "Data." A gate electrode 125 of the second TFT TR2 is connected to a second electrode 162 of the first TFT TR1, a first electrode 162 of the second TFT TR2 is connected to the power voltage supply line VDD 16, and a second electrode 162 of the second TFT TR2 is connected to an anode E1 of the OLED. Here, the first TFT TR1 operates as a switching transistor, whereas the second TFT TR2 operates as a driving transistor. Although the first TFT TR1 and the second TFT TR2 are P-type transistors in the embodiment shown in FIG. 3, present embodiments are not limited thereto. At least one of them may be an N-type transistor.

The capacitor C is connected between the second electrode 161 of the first TFT TR1 and the power voltage supply line "VDD" 16. The first electrode 12 of the capacitor C includes the first area 121 and the second area 122 electrically connected to each other via the first bridge 123. The second electrode 14 of the capacitor C includes the third area 141 and the fourth area 142 electrically connected to each other, via the second bridge 143.

The first electrode 12 is formed on a layer. The layer under the first electrode 12 has a material that is identical to one material of the semiconductor layers 144 and 145 of the first and second TFTs TR1 and TR2. The second electrode 14 is formed on a layer. The layer under the second electrode has a material that is identical to one material of the semiconductor layers 144 and 145 of the first and second TFTs TR1 and TR2. The material of the second electrode is different from the material of the first electrode. The first wiring unit 16, which is the power voltage supply line "VDD," is formed on the insulation layer 15. The first wiring unit 16 is connected to the first area 121 of the first electrode 12 and is arranged at a location overlapping the first area 21.

The capacitor C functions as a storage capacitor for storing a data signal while the data signal is being transmitted to the first TFT TR1.

The structure shown in FIG. 4 is merely an example, and present embodiments are not limited thereto. In other words, the first electrode 12 may be formed on a layer. The layer under the first electrode 12 has a material that is identical to one material of the semiconductor layers 144 and 145, the gate electrodes 124 and 125, and the source and drain electrodes 161 and 162 of the first and second TFTs TR1 and TR2. The second electrode 14 may be formed on a layer. The layer under the second electrode 14 has a material that is identical to one material of the semiconductor layers 144 and 145, the gate electrodes 124 and 125, and the source and drain electrodes 161 and 162 of the first and second TFTs TR1 and TR2.

The OLED includes a pixel electrode E1 connected to one of the source and drain electrodes 162 of the second TFT TR2, a counter electrode E2 facing the pixel electrode E1, and a light emitting layer EL located between the pixel electrode E1 and the counter electrode E2.

In the organic light emitting display apparatus 100 including the capacitor C according to the present embodiment if the dielectric layer 13 is damaged by particles at the second portion A12 where the second area 122 and the fourth area 142 are located and the first wiring unit 16 is not connected, damage of the entire capacitor C may be prevented. The capacitor C may be prevented from damage by floating the second area 122 and the fourth area 142 by cutting the first bridge 123 and the second bridge 143, or by floating the second area 122 by cutting the first bridge 123. Dark spot defects due to defects of the capacitor C may be prevented. Thus, pixel defects of the organic light emitting display apparatus 100 may be reduced.

Although the organic light emitting display apparatus 100 is a flat panel display device, present embodiments are not limited thereto. Present embodiments may be applied to various light emitting display devices, i.e., a liquid crystal display (LCD) device.

Figure 5:
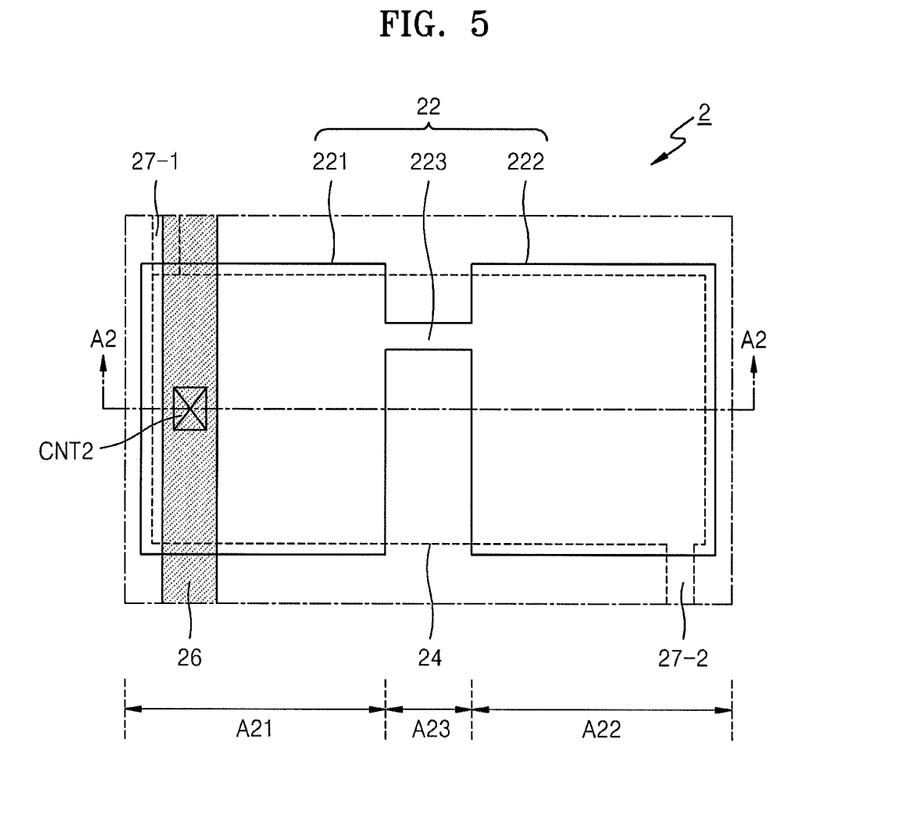
FIG. 5 is a schematic plan view of a capacitor device according to a second embodiment.
Figure 6:
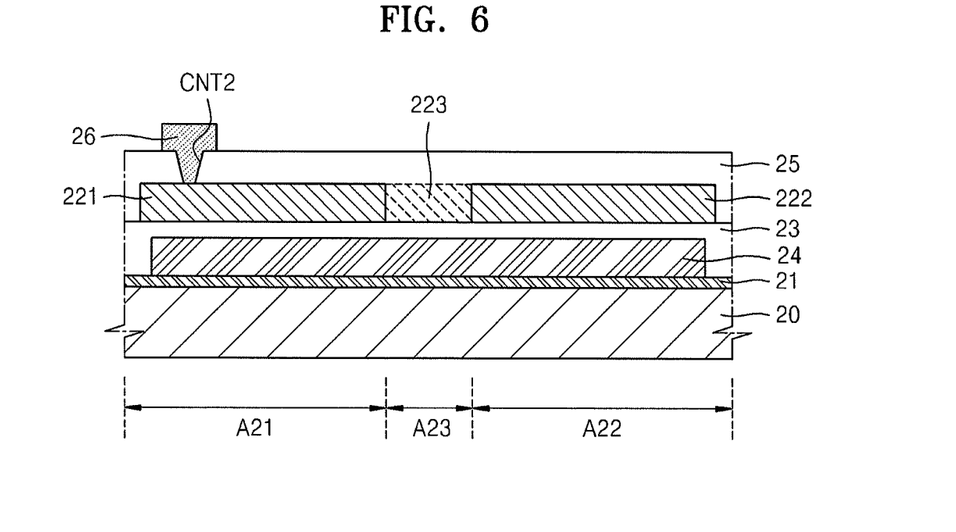
FIG. 6 is a sectional view taken along line A2-A2 of FIG. 5.

FIG. 5 is a schematic plan view of a capacitor device 2 according to a second embodiment. FIG. 6 is a sectional view taken along line A2-A2 of FIG. 5. The descriptions below will be given with respect to differences between the capacitor device 2 according to the present embodiment, and the capacitor device 1 according to the first embodiment.

Referring to FIGS. 5 and 6, the capacitor device 2 includes a substrate 20, a first electrode 22 and a second electrode 24 disposed on a buffer layer 21 to face each other, and a dielectric layer 23 located between the first electrode 22 and the second electrode 24.

The first electrode 22 includes a first area 221 and a second area 222, which are formed on the same layer and are separated from each other, and a first bridge 223, which is located between the first area 221 and the second area 222 and electrically interconnects the first area 221 and the second area 222. However, unlike the second electrode 14 according to the first embodiment, the second electrode 24 is not separated by a bridge and is formed as a single body.

A first wiring unit 26 is connected to the first electrode 22, and second wiring units 27-1 and 27-2 are connected to the second electrode 24. The first wiring unit 26 is formed on an insulation layer 25, is connected to the first area 221 of the first electrode 22 via a second contact hole CNT2, and is arranged at a location overlapping the first area 221.

If the dielectric layer 23 is damaged by particles at a second portion A22, where the second area 222 is located and the first wiring unit 26 is not connected, damage of the entire capacitor device 2 may be prevented. The entire capacitor device 2 may be prevented from damage by floating the second area 222. The second area 222 may be floated by cutting the first bridge 223. In other words, although the entire area is reduced, functions of the capacitor device 2 may be performed only with a first portion A21, where the first area 221 and the second electrode 24, corresponding to the first area 221 are located. Thus, the entire capacitor device 2 may be prevented from being damaged. It is not necessary to form a complicated bridge to the second electrode 24. Thus, designing the capacitor device 2 may be easier.

Figure 7:
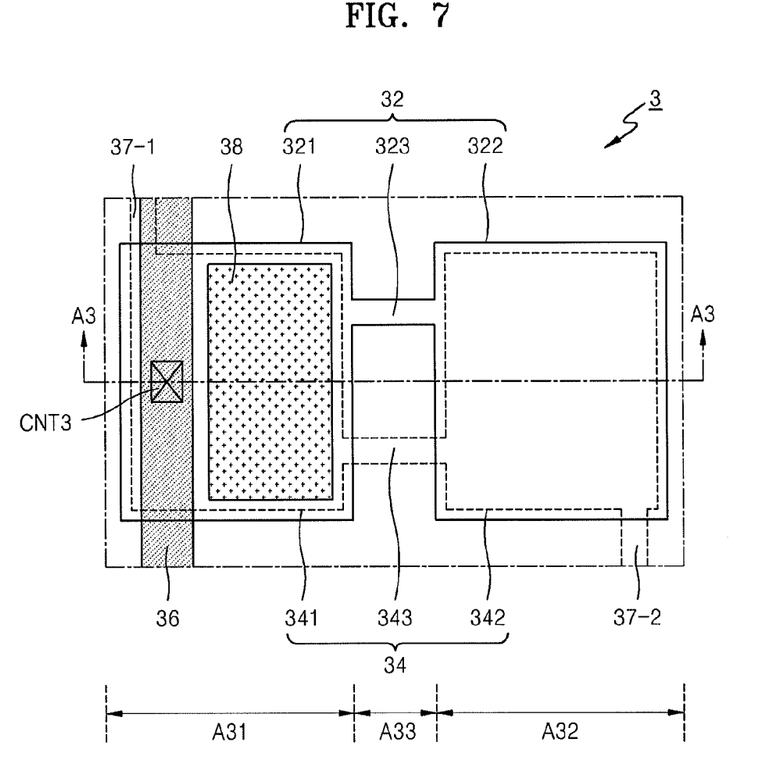
FIG. 7 is a schematic plan view of a capacitor device according to a third embodiment.
Figure 8:
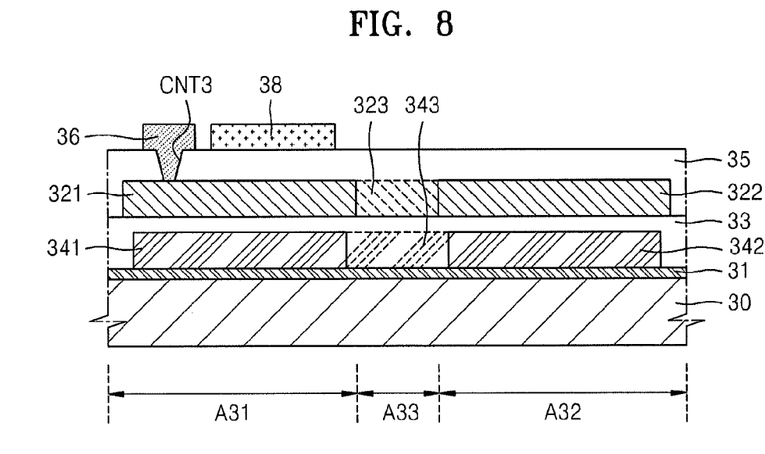
FIG. 8 is a sectional view taken along line A3-A3 of FIG. 7.
Figure 9:
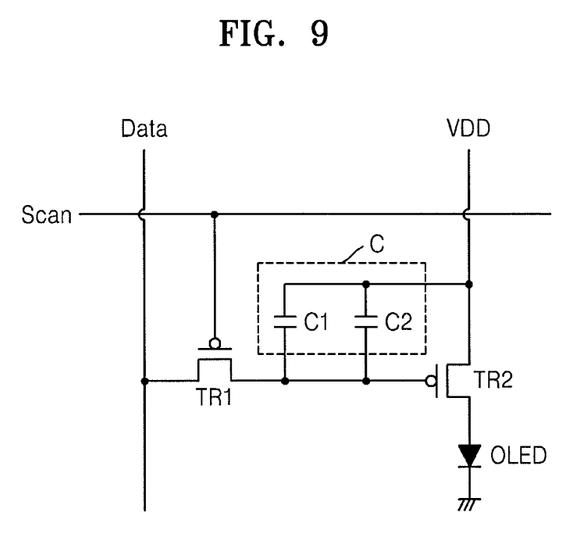
FIG. 9 is a circuit diagram of an organic light emitting display apparatus including the capacitor according to the third embodiment.

FIG. 7 is a schematic plan view of a capacitor device 3, according to a third embodiment. FIG. 8 is a sectional view taken along line A3-A3 of FIG. 7. FIG. 9 is a circuit diagram of an organic light emitting display apparatus including the capacitor 3 according to the third embodiment.

Referring to FIGS. 7 through 9, the capacitor device 3 according to the present embodiment, includes a first electrode 32 and a second electrode 34 disposed on a substrate 30 to face each other, and a dielectric layer 33 arranged between the first electrode 32 and the second electrode 34. Furthermore, a third electrode 38 is arranged on the first electrode 32 via an insulation layer 35.

The first electrode 32 includes a first area 321 and a second area 322, which are formed on the same layer and separated from each other, and a first bridge 323, which is located between the first area 321 and the second area 322 and electrically interconnects the first area 321 and the second area 322.

The second electrode 34 includes a third area 341 and a fourth area 342, which are formed on the same layer and separated from each other, and a second bridge 343, which is located between the third area 341 and the fourth area 342 and electrically interconnects the third area 341 and the fourth area 342. The third area 341 and the fourth area 342 are arranged to correspond to the first area 321 and the second area 322, respectively.

A first wiring unit 36 is connected to the first electrode 32, and second wiring units 37-1 and 37-2 are connected to the second electrode 34. The first wiring unit 36 is formed on the insulation layer 35, is connected to the first area 321 of the first electrode 32 via a third contact hole CNT3, and may be arranged at a location overlapping the first area 321.

The third electrode 38 is located to face the first electrode 32 and is located at a location corresponding to the first area 321 or the second area 322 to which the first wiring unit 36 is connected and at a location corresponding to the third area 341 or the fourth area 342 to which the first wiring unit 36 is connected.

Referring to FIG. 9, in a pixel circuit unit of an organic light emitting display apparatus including the capacitor device 3 according to the present embodiment, the capacitor C is connected in parallel between the second electrode 161 of the first TFT TR1 and the power voltage supply line "VDD" 16. A first capacitance C1 is formed between the first electrode 32 and the third electrode 38, and a second capacitance C2 is formed between the first electrode 32 and the second electrode 34, where the first capacitance C1 and the second capacitance C2 are connected to each other in parallel.

If the dielectric layer 33 is damaged by particles at a second portion A32 where the second area 322 and the fourth area 342 are located, and the first wiring unit 36 is not connected, damage of the entire capacitor device 3 may be prevented. The entire capacitor 3 may be prevented from damage by floating the second area 322 and the fourth area 342 by cutting the first bridge 323 and the second bridge 343, or by floating the second area 322 by cutting the first bridge 323. Although the entire area is reduced, functions of the capacitor device 3 may be performed only with a first portion A31 where the first area 321, the third area 341, and the third electrode 38 are located. Thus, the entire capacitor device 3 may be prevented from being damaged. Since the first area 321, the third area 341, and the third electrode 38 are connected in parallel, reduction of capacitance due to the reduced area may be compensated.

An organic light emitting display apparatus including the capacitor device 3 according to the present embodiment, may prevent the occurrence of dark spot defects due to defects of the capacitor C. Thus, pixel defects of the organic light emitting display apparatus may be reduced.

Figure 10:
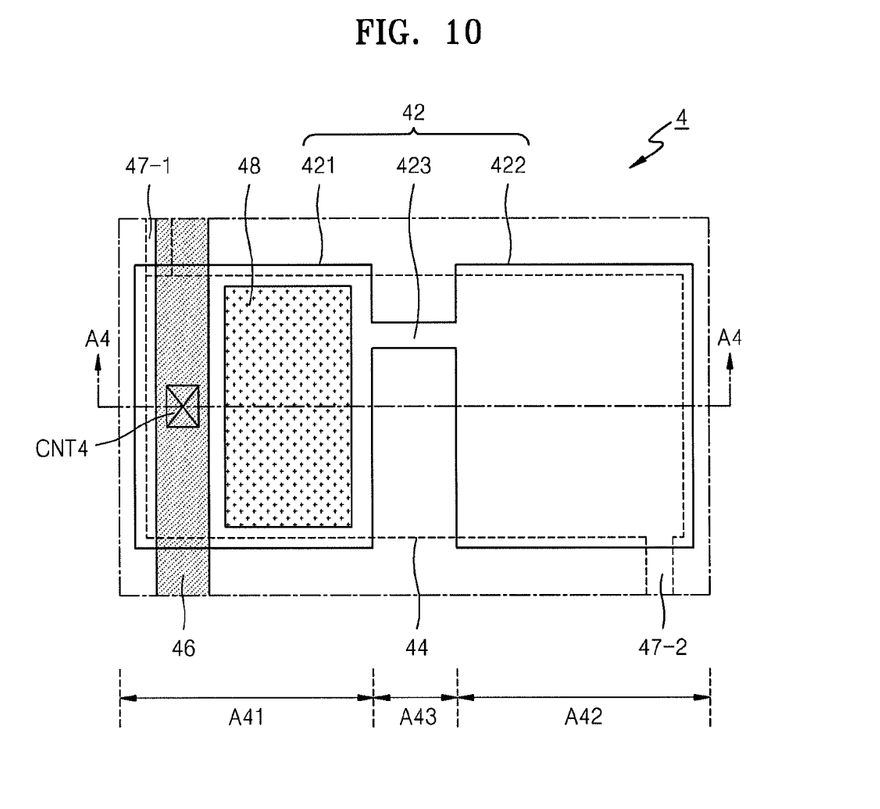
FIG. 10 is a schematic plan view of a capacitor device according to a fourth embodiment.
Figure 11:
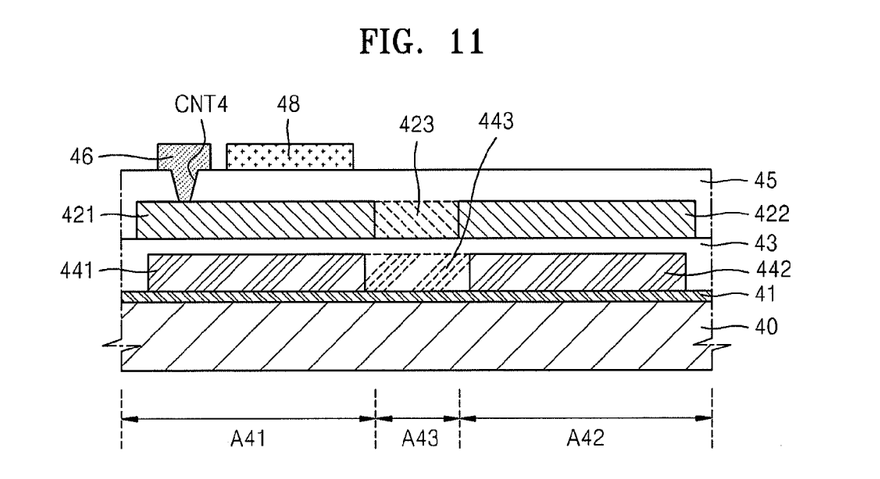
FIG. 11 is a sectional view taken along line A4-A4 of FIG. 10.

FIG. 10 is a schematic plan view of a capacitor device 4 according to a fourth embodiment. FIG. 11 is a sectional view taken along line A4-A4 of FIG. 10.

Referring to FIGS. 10 through 11, the capacitor device 4 according to the present embodiment, includes a first electrode 42 and a second electrode 44, disposed on a substrate 40 to face each other, and a dielectric layer 43, arranged between the first electrode 42 and the second electrode 44. Furthermore, a third electrode 48 is arranged on the first electrode 42 via an insulation layer 45.

The first electrode 42 includes a first area 421 and a second area 422, which are formed on the same layer and separated from each other, and a first bridge 423, which is located between the first area 421 and the second area 422 and electrically interconnects the first area 421 and the second area 422. However, similar to the second electrode 44 according to the second embodiment described above, the second electrode 44 is not separated by a bridge and is formed as a single body.

A first wiring unit 46 is connected to the first electrode 42, and second wiring units 47-1 and 47-2 are connected to the second electrode 44. The first wiring unit 46 is formed on the insulation layer 45, is connected to the first area 421 of the first electrode 42 via a fourth contact hole CNT4, and may be arranged at a location overlapping the first area 421.

The third electrode 48 is located to face the first electrode 42 and is also located at a location corresponding to the first area 412 or the second area 422 to which the first wiring unit 46 is connected.

In the capacitor device 4 according to the present embodiment, a first capacitance is formed between the first electrode 42 and the third electrode 48, and a second capacitance is formed between the first electrode 42 and the second electrode 44, wherein the first capacitance and the second capacitance are connected to each other in parallel.

If the dielectric layer 43 is damaged by particles at a second portion A42, where the second area 422 are located and the first wiring unit 36 is not connected, damage of the entire capacitor device 4 may be prevented by floating the second area 422. Floating the second capacitor may occur by cutting the first bridge 423. Although the entire area of the capacitor device 4 is reduced, functions of the capacitor device 4 may be performed only with a first portion A31 where the first area 421, the second electrode 44 corresponding to the first area 421, and the third electrode 48 are located. Thus, the entire capacitor device 4 may be prevented from being damaged. Since the first area 421, the second electrode 44 corresponding to the first area 421, and the third electrode 48 are connected in parallel, reduction of capacitance due to the reduced area may be compensated. It is not necessary to form a complicated bridge to the second electrode 44. Thus, designing the capacitor device 4 may be easier.

Figure 12:
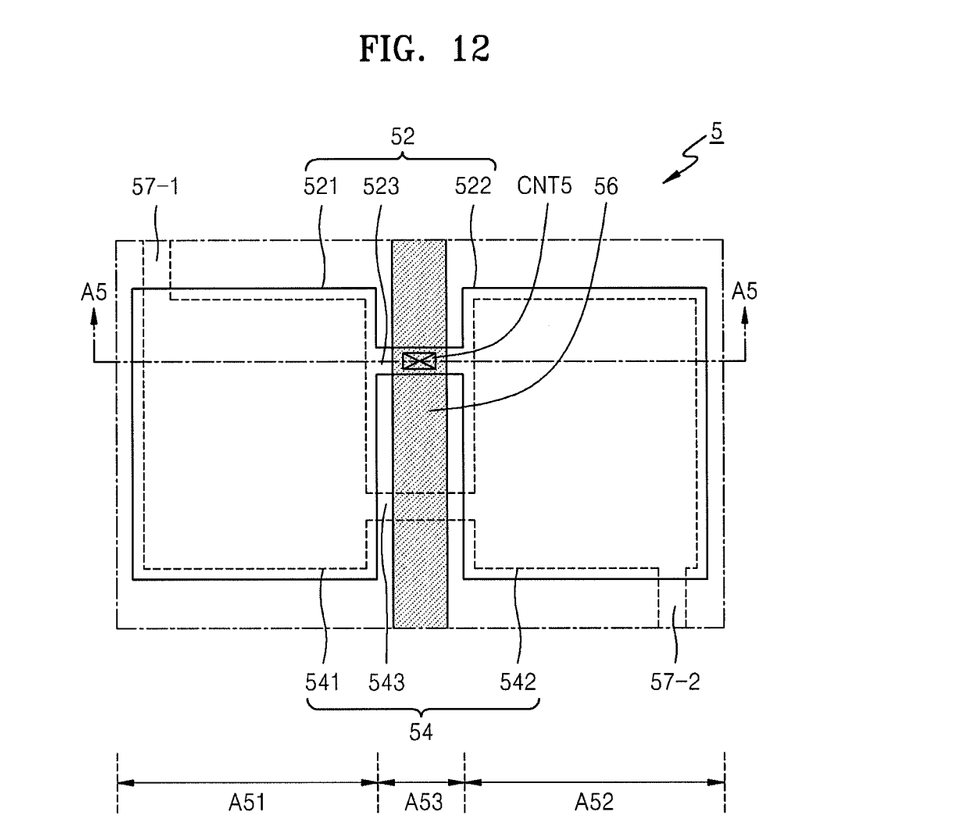
FIG. 12 is a schematic plan view of a capacitor device according to a fifth embodiment.
Figure 13:
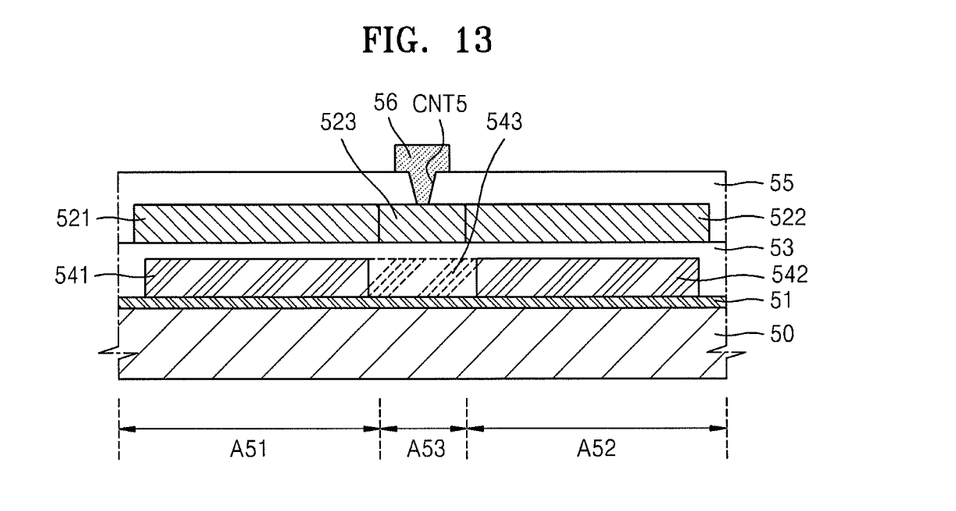
FIG. 13 is a sectional view taken along line A5-A5 of FIG. 12.

FIG. 12 is a schematic plan view of a capacitor device 5 according to a fifth embodiment. FIG. 13 is a sectional view taken along line A5-A5 of FIG. 12.

Referring to FIGS. 12 and 13, the capacitor device 5 according to the present embodiment, includes a substrate 50, a first electrode 52 and a second electrode 54 that are arranged on a buffer layer 51 to face each other, and a dielectric layer 53 located between the first electrode 52 and the second electrode 54.

The first electrode 52 includes a first area 521 and a second area 522, formed on the same layer and separated from each other, and a first bridge 523, which is located between the first area 521 and the second area 522 and electrically interconnects the first area 521 and the second area 522.

The second electrode 52 also includes a third area 541 and a fourth area 542, formed on the same layer and separated from each other, and a second bridge 543, which is located between the third area 541 and the fourth area 542 and electrically interconnects the third area 541 and the fourth area 542. The third area 541 and the fourth area 542 are arranged to correspond to the first area 521 and the second area 522, respectively.

A first wiring unit 56 is connected to the first bridge 523 of the first electrode 52, and second wiring units 57-1 and 57-2 are connected to the second electrode 54. The first wiring unit 56 is formed on an insulation layer 55, is connected to the first bridge 523 of the first area 521 of the first electrode 52 via a fifth contact hole CNT5. Unlike the first embodiment, the first wiring unit 56 is connected to both the first area 521 and the second area 522.

If the dielectric layer 53 is damaged by particles at a first portion A51 where the first area 521 and the third area 541 are located, or a second portion A52 where the second area 522 and the fourth area 542 are located, damage of the entire capacitor device 5 may be prevented. The capacitor device 5 may be prevented from damage by floating the first area 521 and the third area 541 by cutting the first bridge 523 and the second bridge 543 between the first wiring unit 56 and the first portion A51, or by floating the first area 521 by cutting the first bridge 523. Damage of the entire capacitor device 5 may be prevented by floating the second area 522 and the fourth area 542 by cutting the first bridge 523 and the second bridge 543, between the first wiring unit 56 and the second portion A52 or by floating the second area 522 by cutting the first bridge 523.

In the capacitor devices 1 through 4 according to the previous embodiments, only the first portions A11 through A41, to which the first wiring units 16 through 46 are connected, may function as capacitors. Therefore, if the first portions A11 through A41 are short-circuited by various particles, the entire capacitor devices 1 through 4 may be damaged. However, in the capacitor device 5, according to the present embodiment, the first wiring unit 56 is connected to both the first portion A51 and the second portion A52. Thus, at least one of the first and second portions A51 and A52 may function as a capacitor. As a result, defects of the entire capacitor device 5 may be further reduced, in comparison to the capacitor devices 1 through 4 according to the previous embodiments.

Figure 14:
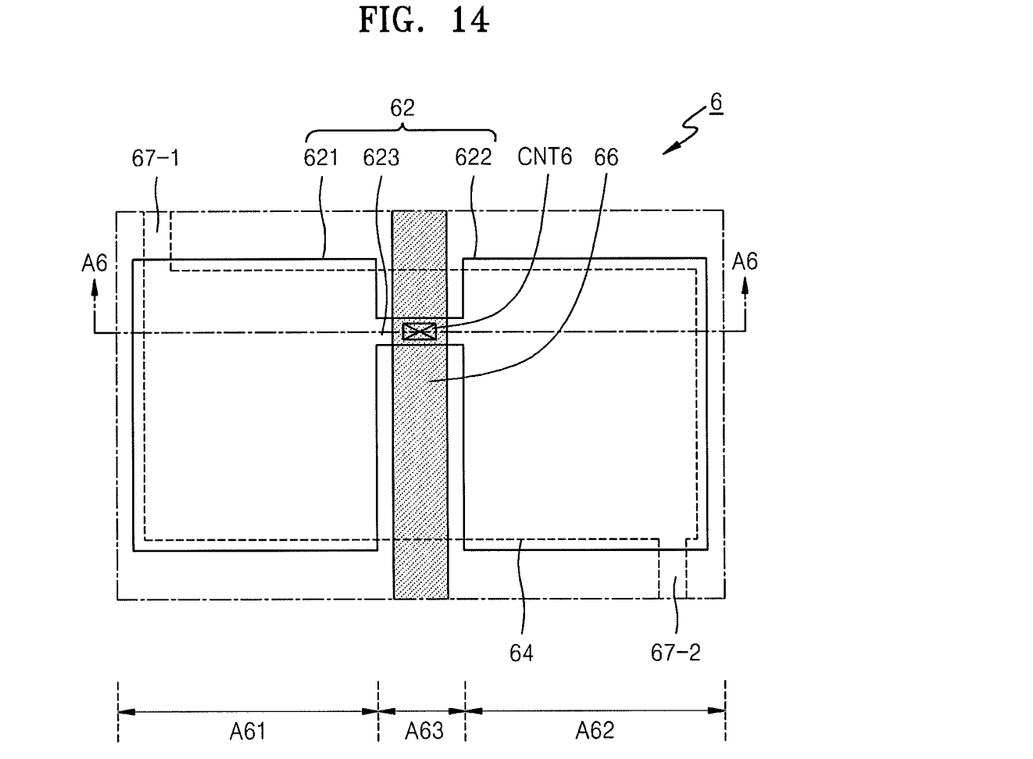
FIG. 14 is a schematic plan view of a capacitor device according to a sixth embodiment.
Figure 15:
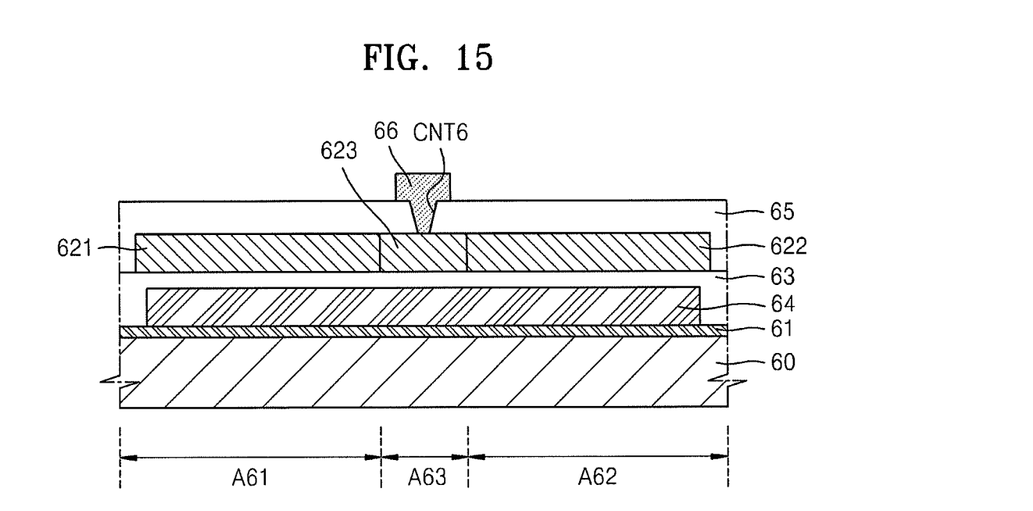
FIG. 15 is a sectional view taken along line A6-A6 of FIG. 14.

FIG. 14 is a schematic plan view of a capacitor device 6 according to a sixth embodiment. FIG. 15 is a sectional view taken along line A6-A6 of FIG. 14.

Referring to FIGS. 14 and 15, the capacitor device 6 according to the present embodiment, includes a substrate 60, a first electrode 62 and a second electrode 64 arranged on a buffer layer 61 to face each other, and a dielectric layer 63 located between the first electrode 62 and the second electrode 64.

The first electrode 62 includes a first area 621 and a second area 622, formed on the same layer and separated from each other, and a first bridge 623, which is located between the first area 621 and the second area 622 and electrically interconnects the first area 621 and the second area 622. However, unlike the second electrode 54, according to the previous embodiment, the second electrode 64 is not separated by a bridge and is formed as a single body.

A first wiring unit 66 is connected to the first bridge 623 of the first electrode 62, and second wiring units 67-1 and 67-2 are connected to the second electrode 64. The first wiring unit 66 is formed on an insulation layer 65 and is connected to the first area 621 of the first electrode 62 via a sixth contact hole CNT6. Thus, the first wiring unit 66 is connected to both the first area 621 and the second area 622.

If the dielectric layer 63 is damaged by various particles at a first portion A61 where the first area 621 is located, or a second portion A62 where the second area 622 is located, damage of the entire capacitor device 6 may be prevented. Damage of the entire capacitor device 6 may be prevented by floating the first area 621 by cutting the first bridge 623 between the first wiring unit 66 and the first portion A61. Damage of the entire capacitor device 6 may be prevented by floating the second area 622 by cutting the first bridge 623 between the first wiring unit 66 and the second portion A62. Similar to the fifth embodiment described above, the first wiring unit 66 is connected to both the first portion A61 and the second portion A62 in the capacitor device 6 according to the present embodiment. Thus, at least one of the first and second portions A61 and A62 may function as a capacitor. As a result, defects of the entire capacitor device 6 may be reduced. Furthermore, it is not necessary to form a complicated bridge to the second electrode 64. Thus, designing the entire capacitor device 6 may be easier.

Figure 16:
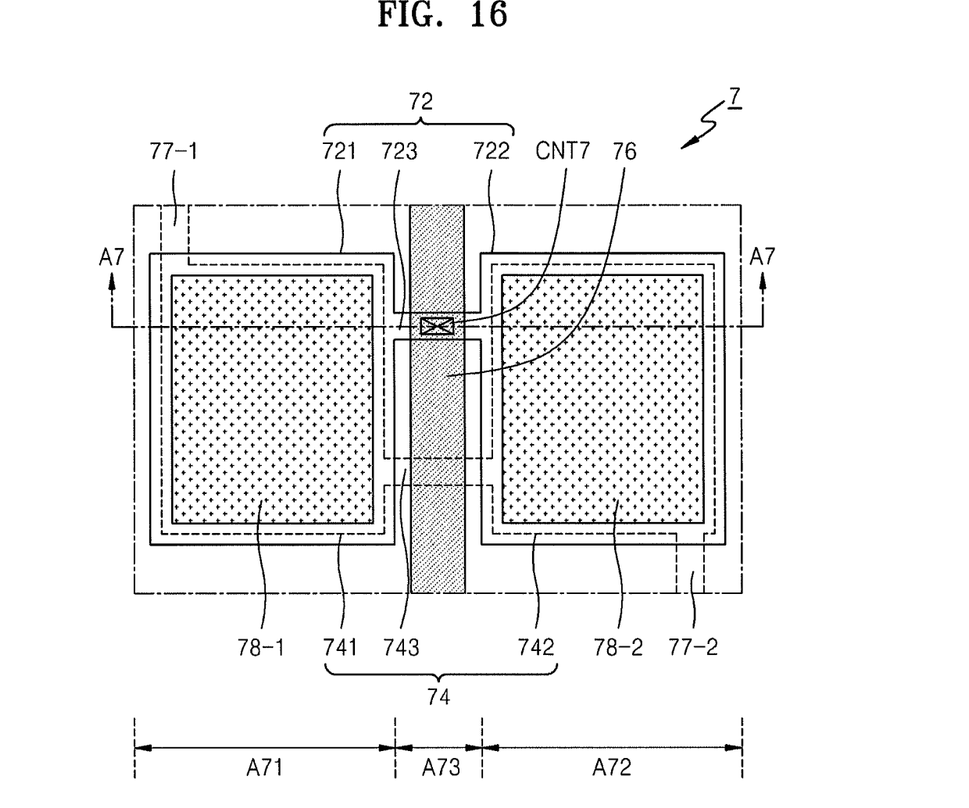
FIG. 16 is a schematic plan view of a capacitor device according to a fifth embodiment.
Figure 17:
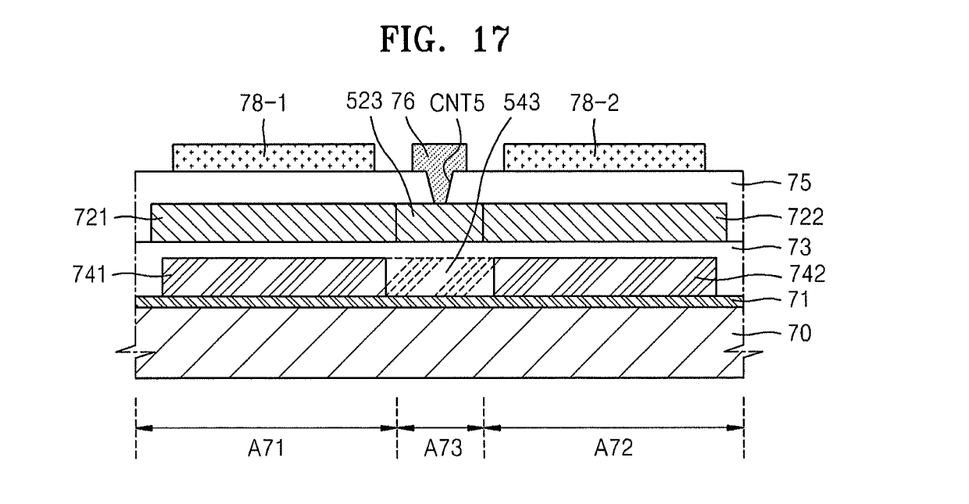
FIG. 17 is a sectional view taken along line A7-A7 of FIG. 16.

FIG. 16 is a schematic plan view of a capacitor device 7 according to a fifth embodiment. FIG. 17 is a sectional view taken along line A7-A7 of FIG. 16.

Referring to FIGS. 16 and 17, the capacitor device 7 according to the present embodiment includes a substrate 70, a first electrode 72 and a second electrode 74 arranged on a buffer layer 71 to face each other, and a dielectric layer 73 located between the first electrode 72 and the second electrode 74. Third electrodes 78-1 and 78-2 are arranged on the first electrode 72 via the insulation layer 75.

The first electrode 72 includes a first area 721 and a second area 722 formed on the same layer and separated from each other, and a first bridge 723, which is located between the first area 721 and the second area 722 and electrically interconnects the first area 721 and the second area 722.

The second electrode 72 also includes a third area 741 and a fourth area 742, formed on the same layer and separated from each other, and a second bridge 743, located between the third area 741 and the fourth area 742 and electrically interconnects the third area 741 and the fourth area 742. The third area 741 and the fourth area 742 are arranged to correspond to the first area 721 and the second area 722, respectively.

A first wiring unit 76 is connected to the first bridge 723 of the first electrode 72, and second wiring units 77-1 and 77-2 are connected to the second electrode 74. The first wiring unit 76 is formed on an insulation layer 75, is connected to the first wiring unit 76 of the first electrode 72 via a seventh contact hole CNT7. Thus, the first wiring unit 76 is connected to both the first area 721 and the second area 722.

The third electrodes 78-1 and 78-2 are separately formed on the insulation layer 75 in a first portion A71 where the first area 721 and the third area 741 are located, or a second portion A72 where the second area 722 and the fourth area 742 are located.

Therefore, in the capacitor device 7 according to the present embodiment, a first capacitance is formed between the first electrode 72 and the third electrode 78-1, and a second capacitance is formed between the first electrode 72 and the second electrode 74, in the first portion A71, wherein the first capacitance and the second capacitance are connected to each other in parallel. A first capacitance is formed between the first electrode 72 and the third electrode 78-2, and a second capacitance is formed between the first electrode 72 and the second electrode 74, in the first portion A72, wherein the first capacitance and the second capacitance are connected to each other in parallel.

If the dielectric layer 73 is damaged by various particles at the first portion A71 or the second portion A72, damage of the entire capacitor device 7 may be prevented. Damage of the entire capacitor device 7 may be prevented by floating the first area 721 and the third area 741 by cutting the first bridge 723 and the second bridge 743 between the first wiring unit 76 and the first portion A71, or by floating the first area 721 by cutting the first bridge 723. Furthermore, entire damage of the capacitor device 7 may be prevented by floating the second area 722 and the fourth area 742 by cutting the first bridge 723 and the second bridge 743 between the first wiring unit 76 and the second portion A72, or by floating the second area 722 by cutting the first bridge 723. Furthermore, similar to the fifth embodiment described above, the first wiring unit 76 is connected to both the first portion A71 and the second portion A72 in the capacitor device 7 according to the present embodiment. Thus, at least one of the first and second portions A71 and A72 may function as a capacitor. As a result, defects of the capacitor device 7 may be reduced. Since the first area 721, the third area 741, and the third electrode 78-1 that are located in the first area A71 are connected in parallel, reduction of capacitance due to the reduced area may be compensated for. Since the second area 722, the fourth area 742, and the third electrode 78-2 are located in the second area A72 connected in parallel, reduction of capacitance due to the reduced area may be compensated.

Figure 18:
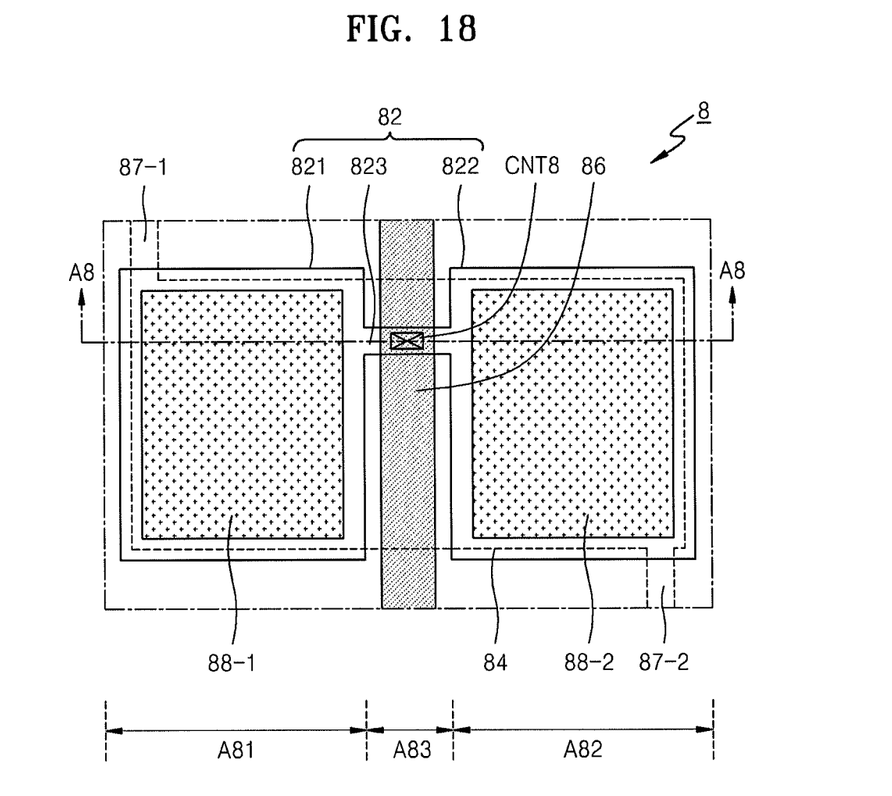
FIG. 18 is a schematic plan view of a capacitor device according to an eighth embodiment.
Figure 19:
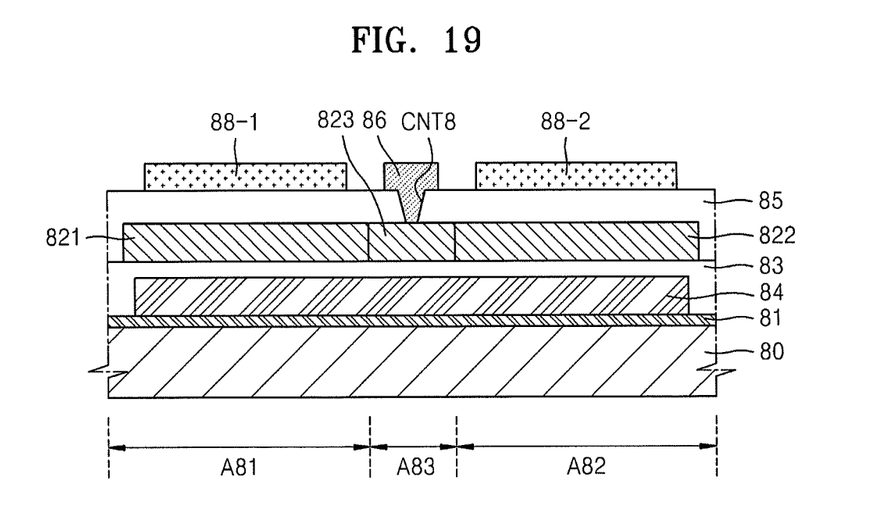
FIG. 19 is a sectional view taken along line A8-A8 of FIG. 18.

FIG. 18 is a schematic plan view of a capacitor device 8 according to an eighth embodiment. FIG. 19 is a sectional view taken along line A8-A8 of FIG. 18.

Referring to FIGS. 18 and 19, the capacitor device 8 according to the present embodiment includes a substrate 80, a first electrode 82 and a second electrode 84 arranged on a buffer layer 81 to face each other, and a dielectric layer 83 located between the first electrode 82 and the second electrode 84. Furthermore, third electrodes 88-1 and 88-2 are arranged on the first electrode 82 via the insulation layer 85.

The first electrode 82 includes a first area 821 and a second area 822, formed on the same layer and are separated from each other, and a first bridge 823, which is located between the first area 821 and the second area 822 and electrically interconnects the first area 821 and the second area 822. However, the second electrode 64 is not separated by a bridge and is formed as a single body.

A first wiring unit 86 is connected to the first bridge 823 of the first electrode 82, and second wiring units 87-1 and 87-2 are connected to the second electrode 84. The first wiring unit 86 is formed on an insulation layer 85, is connected to the first wiring unit 86 of the first electrode 82 via an eighth contact hole CNT8. Thus, the first wiring unit 86 is connected to both the first area 821 and the second area 822.

The third electrodes 88-1 and 88-2 are separately formed on the insulation layer 85 in a first portion A81 where the first area 821 is located, or a second portion A82 where the third area 841 is located.

In the capacitor device 8 according to the present embodiment, a first capacitance is formed between the first electrode 82 and the third electrode 88-1, and a second capacitance is formed between the first electrode 82 and the second electrode 84, in the first portion A81, wherein the first capacitance and the second capacitance are connected to each other in parallel. Furthermore, a first capacitance is formed between the first electrode 82 and the third electrode 88-2, and a second capacitance is formed between the first electrode 82 and the second electrode 84, in the first portion A82, wherein the first capacitance and the second capacitance are connected to each other in parallel.

If the dielectric layer 83 is damaged by various particles at the first portion A81 or the second portion A82, damage of the entire capacitor device 8 may be prevented by floating the first area 821 by cutting the first bridge 823 between the first wiring unit 86 and the first portion A81. Damage of the entire capacitor device 8 may be prevented by floating the second area 822 by cutting the first bridge 823 between the first wiring unit 86 and the second portion A82. Furthermore, similar to the fifth embodiment described above, the first wiring unit 86 is connected to both the first portion A81 and the second portion A82 in the capacitor device 8 according to the present embodiment. Thus, at least one of the first and second portions A81 and A82 may function as a capacitor. As a result, defects of the capacitor device 8 may be reduced. Since the first area 821, the second electrode 84, and the third electrode 88-1 are located in the first area A81 and are connected in parallel, reduction of capacitance due to the reduced area may be compensated. It is not necessary to form a complicated bridge to the second electrode 84. Thus, designing the capacitor device 2 may be easier.

By way of summation and review, a capacitor of a display apparatus of the related art includes a first electrode, a second electrode, and an insulation layer. The insulating layer functions as a dielectric layer between the first electrode and the second electrode. If the dielectric layer is damaged by various particles, a short-circuit occurs between the first electrode and the second electrode. Thus, the entire capacitor is damaged. A defect of the entire capacitor causes dark spots and defective pixels in the display apparatus.

Present embodiments may be directed to a capacitor device that prevents the occurrence of defects and dark spots in a display apparatus, and a display apparatus having the capacitor device.

Exemplary embodiments of the inventive concept have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the inventive concept as set forth in the following claims.

What is claimed is:

1. A capacitor device, comprising:
a first electrode, the first electrode being on a first layer and including:
a first area on the first layer and a second area on the first layer, the first area and the second area being separated from each other, and
a first bridge located between the first area and the second area, the first bridge electrically interconnecting the first area and the second area;
a second electrode on a second layer, the second layer being different from the first layer, the second electrode being arranged to face the first electrode;
a dielectric layer between the first electrode and the second electrode; and
a first wiring unit connected to the first electrode.

2. The capacitor device as claimed in claim 1, wherein:
the first wiring unit is connected to the first area or the second area.

3. The capacitor device as claimed in claim 2, further comprising:
a third electrode arranged to face the first electrode at a location corresponding to the first area or the second area to which the first wiring unit is connected.

4. The capacitor device as claimed in claim 3, wherein:
the third electrode is on a same layer as the first wiring unit.

5. The capacitor device as claimed in claim 2, wherein:
the second electrode includes:
a third area and a fourth area, separated from each other, and
a second bridge located between the third area and the fourth area, the second bridge electrically interconnecting the third area and the fourth area.

6. The capacitor device as claimed in claim 5, wherein:
the third area and the fourth area are arranged at locations corresponding to the first area and the second area, respectively.

7. The capacitor device as claimed in claim 5, further comprising:

a third electrode arranged to face the first electrode at a location corresponding to the first area or the second area to which the first wiring unit is connected.

8. The capacitor device as claimed in claim 7, wherein:
the third electrode is on a same layer as the first wiring unit.

9. The capacitor device as claimed in claim 1, wherein:
the first wiring unit is located between the first area and the second area, and
the first wiring unit is connected to the first area or the second area.

10. The capacitor device as claimed in claim 9, wherein:
the second electrode includes:
   a third area and a fourth area, separated from each other, and
   a second bridge located between the third area and the fourth area, the second bridge electrically interconnecting the third area and the fourth area.

11. The capacitor device as claimed in claim 10, wherein:
the third area and the fourth area are arranged at locations corresponding to the first area and the second area, respectively.

12. The capacitor device as claimed in claim 11, further comprising:
a plurality of third electrodes arranged to face the first electrode at a location corresponding to the first area and the second area and a location corresponding to the third area and the fourth area, respectively.

13. The capacitor device as claimed in claim 12, wherein:
the plurality of third electrodes is on a same layer as the first wiring unit.

14. The capacitor device as claimed in claim 1, further comprising:
a third electrode arranged to face the first electrode at a location corresponding to the first area and the second area.

15. The capacitor device as claimed in claim 14, wherein:
the third electrode is on a same layer as the first wiring unit.

16. A flat panel display apparatus, comprising:
at least one thin-film transistor (TFT), each TFT including:
   a semiconductor layer,
   a gate electrode, and
   source and drain electrodes;
a capacitor, which includes:
   a first electrode, the first electrode being on a first layer and including:
      a first area on the first layer and a second area on the first layer, the first area and the second area being separated from each other, and
      a first bridge located between the first area and the second area, the first bridge electrically interconnecting the first area and the second area,
   a second electrode on a second layer, the second layer being different from the first layer, the second electrode being arranged to face the first electrode,
   a dielectric layer between the first electrode and the second electrode; and
   a first wiring unit connected to the first electrode; and
a light emitting device, which includes:
   a pixel electrode connected to the source electrode or the drain electrode,
   a counter electrode facing the pixel electrode, and
   an electroluminescent layer located between the pixel electrode and the counter electrode.

17. The flat panel display apparatus as claimed in claim 16, wherein:
the first layer has an identical material to one of the semiconductor layer, the gate electrode, or the source and drain electrodes, and
the second layer has an identical material to one of the semiconductor layer, the gate electrode, or the source and drain electrodes, the material of the second electrode being different from the material of the first electrode.

18. The flat panel display apparatus as claimed in claim 17, wherein:
the first wiring unit is connected to a power voltage supply line of the flat panel display apparatus, and
a second wiring unit is connected to one of the source or drain electrode of the TFT.

19. The flat panel display apparatus as claimed in claim 18, wherein:
the first wiring unit is located between the first area and the second area, and
the first wiring unit is connected to the first area and the second area.

20. The flat panel display apparatus as claimed in claim 18, wherein:
the first wiring unit is connected to the first area or the second area, and
the power voltage supply line is arranged to overlap the first area or the second area.

21. The flat panel display apparatus as claimed in claim 20, wherein:
the second electrode includes:
   a third area and a fourth area, separated from each other, and
   a second bridge located between the third area and the fourth area, the second bridge electrically interconnecting the third area and the fourth area.

22. The flat panel display apparatus as claimed in claim 20, wherein the capacitor further includes:
a third electrode arranged to face the first electrode at a location corresponding to the first area or the second area to which the first wiring unit is connected, wherein:
the third electrode is on a third layer, and the third layer has an identical material to, one of the semiconductor layer, the gate electrode, or the source and drain electrodes, and
the material of the third electrode is different from the material of the first and second electrodes.

23. The flat panel display apparatus as claimed in claim 22, wherein:
the second electrode includes:
   a third area and a fourth area separated from each other; and
   a second bridge located between the third area and the fourth area, the second bridge electrically interconnecting the third area and the fourth area.

24. The flat panel display apparatus as claimed in claim 16, wherein:
the light emitting device is an organic light emitting diode.

* * * * *